(12) United States Patent
Eguchi et al.

(10) Patent No.: US 6,946,636 B2
(45) Date of Patent: Sep. 20, 2005

(54) IMAGE PICKUP APPARATUS PROVIDING A BIAS BETWEEN DIFFERENT PIXEL AREAS DURING SIGNAL ACCUMULATION

(75) Inventors: Tomoko Eguchi, Atsugi (JP); Toru Koizumi, Yokohama (JP); Katsuhito Sakurai, Machida (JP); Fumihiro Inui, Yokohama (JP); Hiroki Hiyama, Zama (JP); Masaru Fujimura, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 555 days.

(21) Appl. No.: 09/790,601

(22) Filed: Feb. 23, 2001

(65) Prior Publication Data

US 2002/0051229 A1 May 2, 2002

(30) Foreign Application Priority Data

Feb. 28, 2000 (JP) ........................................ 2000-051909
Feb. 16, 2001 (JP) ........................................ 2001-040168

(51) Int. Cl.[7] ............................. H01L 27/00; H01L 31/00
(52) U.S. Cl. ............................... 250/208.1; 250/214.1; 257/292; 348/294
(58) Field of Search ......................... 250/208.1, 214.1; 257/225–234, 292; 348/294, 302, 311

(56) References Cited

U.S. PATENT DOCUMENTS

| | | | | |
|---|---|---|---|---|
| 4,985,619 A | * | 1/1991 | Arques | 250/208.1 |
| 5,587,738 A | * | 12/1996 | Shinohara | 348/302 |
| 5,710,446 A | * | 1/1998 | Chi et al. | 257/225 |
| 6,002,287 A | | 12/1999 | Ueno et al. | 327/307 |
| 6,674,470 B1 | | 1/2004 | Tanaka et al. | 348/302 |

FOREIGN PATENT DOCUMENTS

| | | |
|---|---|---|
| JP | 09247538 | 9/1997 |
| JP | 10150182 | 6/1998 |
| JP | 11261899 | 9/1999 |
| JP | 2000059691 | 2/2000 |

* cited by examiner

*Primary Examiner*—Stephone B. Allen
(74) *Attorney, Agent, or Firm*—Fitzpatrick, Cella, Harper & Scinto

(57) ABSTRACT

In order to reduce the noise in the readout signal, the invention provides an image pickup apparatus comprising a pixel including a photoelectric conversion unit for converting the incident light and accumulating a resulting electrical signal, and a transfer switch reading the electrical signal accumulated in the photoelectric conversion unit or a signal based on such electrical signal, and potential control means for maintaining the potential of the signal line higher than that of the photoelectric conversion unit while the photoelectric conversion unit accumulates the electrical signal.

6 Claims, 7 Drawing Sheets

IMAGE PICKUP APPARATUS PROVIDING A BIAS BETWEEN DIFFERENT PIXEL AREAS DURING SIGNAL ACCUMULATION

BACKGROUND OF THE INVENTION

1. Field of the Invention

The present invention relates to an image pickup apparatus for picking up the image of an object.

2. Related Background Art

In the field of the solid-state image pickup element, the cell size of the photoelectric conversion unit formed by the micro semiconductor process has been actively reduced in recent years for achieving the high resolution. On the other hand, in order to avoid the loss of the output electric signal converted in the photoelectric conversion unit, the solid-state image pickup element of amplifying type capable of amplifying and outputting the electric signal is attracting attention. Such solid-state image pickup elements of amplifying type include image sensors of MOS type, AMI type, CMD type, bipolar type etc.

Among these, the MOS solid-state image pickup element accumulates the photocarriers, generated by a photodiode, in the gate electrode of a MOS transistor, and outputs potential change of the gate thereof to an output unit after charge amplification according to a drive timing from a scanning circuit. Of such MOS type solid-state image pickup element, a device in which the photoelectric conversion unit and the peripheral circuits are all formed by a CMOS process is attracting particular attention.

FIG. 1 shows an internal configuration of a conventional solid-state image pickup element. In the solid-state image pickup element shown in FIG, 1, there are provided a photodiode 1 for converting the incident light into an electrical signal, a transfer switch 2 for transferring the signal charge from the photodiode 1 to a floating diffusion area 11, a source follower amplifier 10 (an amplifying transistor 10 and a constant current source 7) and a constant voltage source for amplifying and outputting the transferred signal, a selector switch 6 for reading the signal accumulated in a floating diffusion area 11 into a vertical signal line 13, and a reset switch 3 and a reset voltage source 4 for resetting the floating diffusion area 11 to a potential $V_{PR}$.

The solid-state image pickup element shown in FIG. 1 is further provided with a vertical scanning circuit 14 for outputting control signals to the gates of the transfer switch 2, reset switch 3 and selector switch 6 for switching an on/off state thereof, transfer gates 15a, 15b for eliminating a fixed pattern noise generated by the switching of an on/off state of the transfer switch 2 etc., and a signal accumulating unit 16 for accumulating a signal which is input when the transfer gates 15a, 15b are turned on.

FIG. 1 shows an array of four pixels, but the number of pixels is not particularly limited, and the pixels may be arranged one-dimensionally or two-dimensionally.

FIG. 2 is a view showing a wave form of a control signal outputted from the vertical scanning circuit 14 shown in FIG. 1. In FIG. 2, there are shown a selection signal φSEL supplied to the gate of the selector switch 6, a reset signal φRES supplied to the gate of the reset switch 3, a transfer gate signal φTX supplied to the gate of the transfer switch 2, a noise signal readout signal φTN and a transfer signal φTS supplied to the gates of the transfer gates 15a, 15b. The gate of each switch is turned on or off respectively when each signal pulse is at the high level state or at the low level state.

In the following there will be explained, with reference to FIG. 2, the function of the solid-state image pickup element shown in FIG. 1. At first, low level signals are supplied to the gates of the selector switch 6 and the transfer switch 2, and a high level signal is supplied to the gate of the reset switch 3. In this state, the photodiode 1 executes photoelectric conversion of the incident light, and accumulates the obtained charge. The floating diffusion area 11 is maintained at a reset potential $V_{PR}$.

Then the transfer gate signal φTX is shifted to the high level state to transfer the charge, accumulated in the photodiode 1, to the floating diffusion area 11 through the transfer switch 2. Then the transfer gate signal φTX is shifted to the low level state, whereupon the photodiode 1 executes the charge accumulation.

Then, immediately after the selection signal φSEL is shifted to the high level state and the reset signal φRES is shifted to the low level state, the noise signal readout signal φTN is shifted to the high level state to input the noise in the solid-state image pickup element into the signal accumulating unit 16 through the vertical signal line 13 and the transfer gate 15b. Then, after the noise signal readout signal φTN is shifted to the low level state, the selection signal φSEL is shifted to the low level state while the transfer gate signal φTX is shifted to the high level state, whereby the charge accumulation in the photodiode 1 is terminated and the charge accumulated therein is transferred to the floating diffusion area 11. Then the transfer gate signal φTX is shifted to the low level state to terminate the charge transfer from the photodiode 1 to the floating diffusion area 11 and to start again the charge accumulation in the photodiode 1. Since the charge accumulated in the photodiode 1 is transferred to the floating diffusion area 11 until the transfer gate signal φ TX is shifted to the low level state, the photodiode 1 is depleted and this state assumes an almost reset state.

Then the selection signal φSEL is shifted to the high level state and the transfer signal φTS is shifted immediately thereafter to the high level state, whereby an amplified signal, amplified by the source follower 10 based on the charge transferred to the floating diffusion area 11, is input into the signal accumulating unit 16 through the vertical signal line 13 and the transfer gate 15a.

In the signal accumulating unit 16, the input signal input through the transfer gate 15b and the input signal input through the transfer gate 15a are so timed that the difference thereof can be calculated by an unrepresented differentiating circuit and are outputted to the output unit. The output unit calculates the difference of the two input signals thereby eliminating the fixed pattern noise generated at the switching of the on/off state of the transfer switch 2.

In the conventional technology, however since the content current source is connected to the vertical signal line, the potential thereof approaches 0 V during the charge accumulation in the photodiode. As a result, the potential of the vertical signal line becomes relatively low and there may result in a weak leak current from the vertical signal line to the photodiode.

Thus a charge injection takes place from the vertical signal line into the photodiode. Consequently, at the charge transfer from the photodiode to the floating diffusion area, a charge based on such leak current is superposed with the charge converted from the incident light, and an amplified signal based on such charges is read out to the vertical signal line.

As explained in the foregoing, the amplified signal thus read out may include the charge obtained by the actual photoelectric conversion and the charge resulting from the potential difference between the photodiode and the vertical signal line, and, in such case, the image based on such amplified signal may be deteriorated.

SUMMARY OF THE INVENTION

The object of the present invention is to prevent the leak current from the signal line to the photoelectric conversion unit such as the photodiode during the charge accumulation therein, thereby reducing the noise in the readout signal.

In order to attain the above-described object, according to one aspect of the present invention, there is provided an image pickup element comprising:

a pixel including a photoelectric conversion unit for converting incident light into an electrical signal and accumulating the electrical signal, and readout means for reading the electrical signal, generated in the photoelectric conversion unit, to a signal line; and potential control means for maintaining the potential of the signal line higher than the potential of photoelectric conversion unit, while the photoelectric conversion unit accumulates the electrical signal.

According to another aspect of the present invention, there is provided an image pickup element comprising:

a pixel including a photoelectric conversion unit having a second area of a second conductive type formed in a first area of a first conductive type and readout means for reading an electrical signal generated in the photoelectric conversion unit to a signal line;

a diffusion area of the second conductive type, formed in the first area and connected to the signal line; and potential control means for maintaining a reverse bias between the first area and the diffusion area, while the photoelectric conversion unit accumulates the electrical signal.

The above and other objects and features of the present invention will become apparent from the following detailed description and the appended claims with reference to the accompanying drawings.

DESCRIPTION OF THE PREFERRED EMBODIMENTS

Now the present invention will be clarified in detail by preferred embodiments thereof, with reference to the accompanying drawings.

Figure 1:
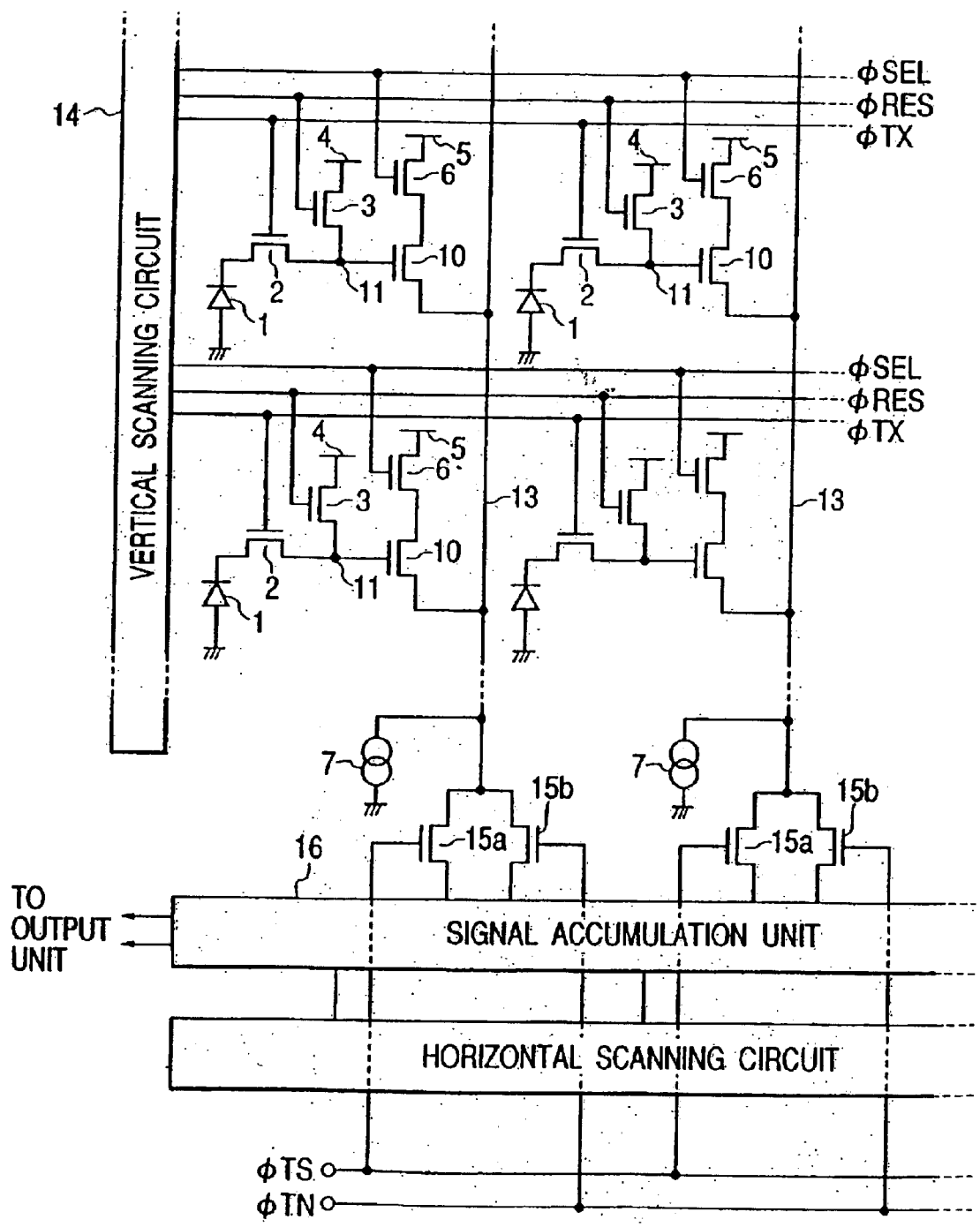
FIG. 1 is an equivalent circuit diagram of a conventional solid-state image pickup element.
Figure 2:
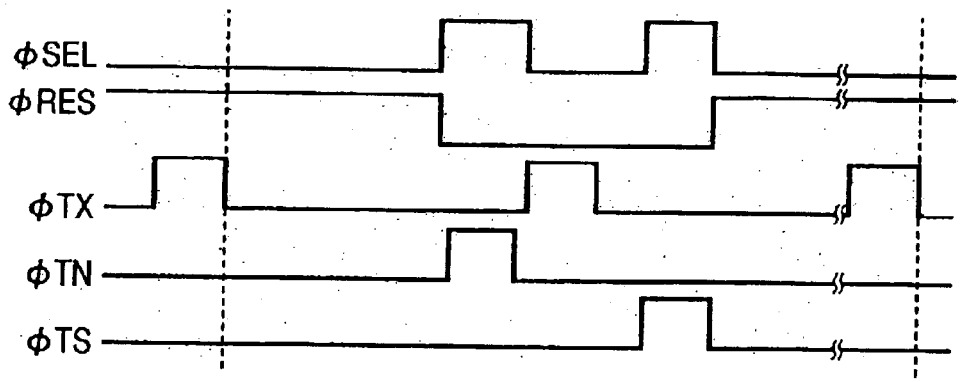
FIG. 2 is a timing chart showing the function of the element shown in FIG. 1.
Figure 3:
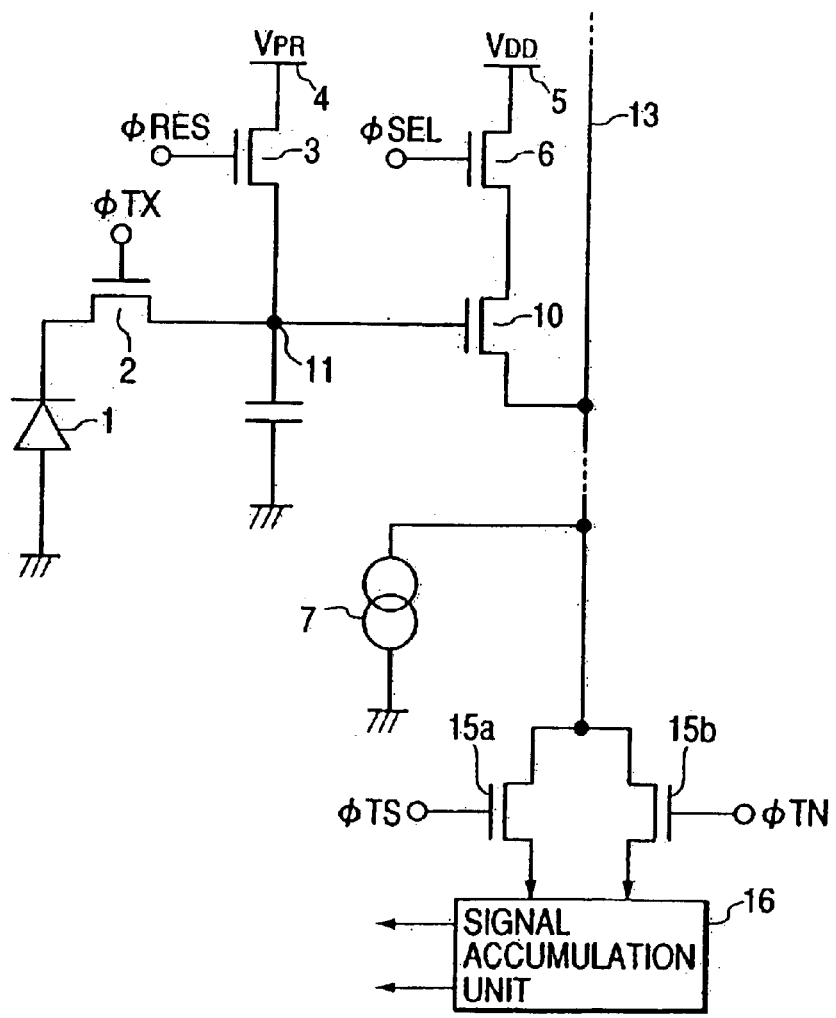
FIG. 3 is an equivalent circuit diagram of a solid-state image pickup element constituting a first embodiment of the present invention.

FIG. 3 is an equivalent circuit diagram of a solid-state image pickup element of a first embodiment of the present invention. In the solid-state image pickup element shown in FIG. 3, there are provided a photodiode 1 constituting a photoelectric conversion unit for converting the incident light signal into an electrical signal; a transfer switch 2 for transferring the signal charge from the photodiode 1 to a floating diffusion area 11 constituting an accumulation area; a source follower (an amplifying transistor 10 and a constant current source 7) for amplifying and outputting the transferred signal; and a constant voltage source 5.

The solid-state image pickup element shown in FIG. 3 is further provided with a selector switch 6 for selecting the photodiode 1 from which the accumulated charge is transferred a reset switch 3 and a reset voltage source 4 for resetting the floating diffusion area 11 to a potential $V_{PR}$; transfer gates 15a, 15b for eliminating a fixed pattern noise generated by switching the on/off state of the transfer switch 2; and a signal accumulation unit 16 for accumulating the signal which is input when the transfer gates 15a, 15b are turned on. A pixel is constituted with the photodiode 1, the transfer switch 2, the reset switch 3, the selector switch 6 and the amplifying transistor 10.

In the present embodiment, the reverse bias photovoltage $V_{REV}$ of the photodiode 1 is maintained at about 1 V when the charge accumulation in the photodiode 1 is started, for example by connecting the anode of the photodiode 1 to the ground and the cathode thereof to the transfer switch 2.

Figure 4:
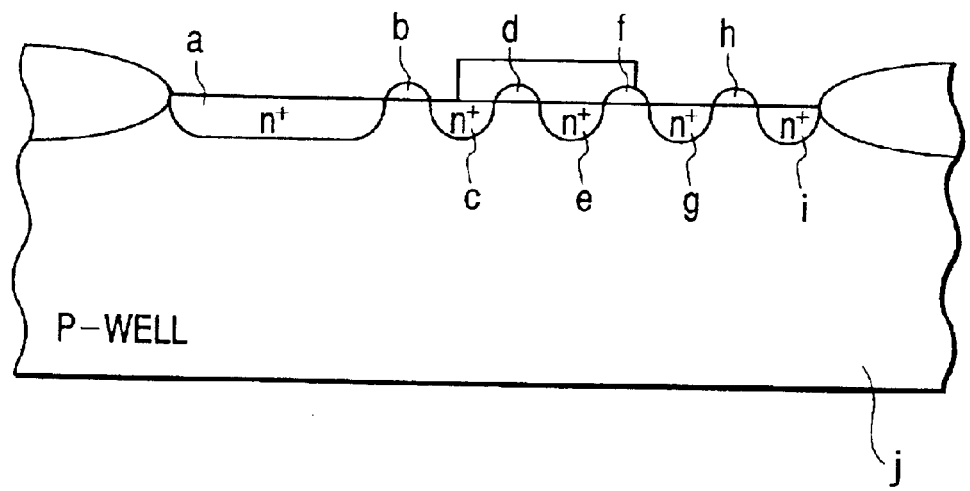
FIG. 4 is a schematic cross-sectional view showing the connection state of various portions of the solid-state image pickup element shown in FIG. 3.

FIG. 4 is a schematic cross-sectional view showing the connection state of various portions of the solid-state image pickup element shown in FIG. 3. In FIG. 4, there are shown areas a: photodiode 1, b: gate of the transfer switch 2 for transferring the charge from the photodiode 1, c: floating diffusion area 11 to which the charge is transferred, d: gate of the reset switch 3, e: reset voltage source 4 and constant voltage source 5, f: gate of the amplifying transistor 10, g: source of the amplifying transistor 10, h: gate of the selector switch 6, and i: diffusion area connected to the vertical signal line 13. The photodiode a to the diffusion area i of n-conductive type ($n^+$ layers) are formed in a p-well j.

Figure 5:
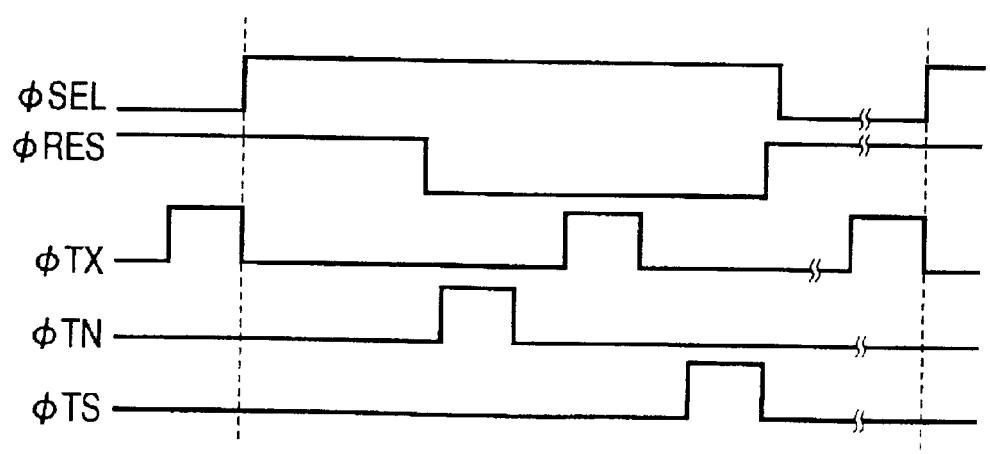
FIG. 5 is a timing chart showing the function of the element shown in FIG. 3.

FIG. 5 is a timing chart showing the function of the solid-state image pickup element shown in FIG. 3. In FIG. 5, there are shown a selection signal φSEL supplied to the gate of the selector switch 6, a reset signal φRES supplied to the gate of the reset switch 3, a transfer gate signal φTX supplied to the gate of the transfer switch 2, and a noise signal readout signal φTN and a transfer signal φTS supplied to the gates of the transfer gates 15a, 15b.

In the present embodiment, the gate of each switch is turned on or off respectively when the pulse of each signal is at the high or low level state.

In the following the function of the solid-state image pickup element shown in FIG. 3 will be explained with reference to FIG. 5. At first, in a state where the reset signal φRES supplied to the gate of the reset switch 3 is shifted to the high level state, the transfer gate signal φTX supplied to the gate of the transfer switch 2 is shifted to the low level state, whereby the photodiode 1 starts to accumulate the charge obtained by photoelectric conversion of the incident light.

In this state, the selection signal φSEL supplied to the gate of the selector switch 6 is maintained at the high level state to hold the diffusion (i in FIG. 4) at a predetermined potential thereby forming a reverse bias between the diffusion area (i in FIG. 4) and the p-well (j in FIG. 4). Also the potential of the vertical signal line 13 is maintained higher than that of the photodiode 1. In this manner there is prevented the leak current from the vertical signal line 13 to the photodiode 1.

Then, after the reset signal φRES supplied to the gate of the reset switch 3 is shifted to the low level state, the noise signal readout signal φTN is shifted to the high level state to input the fixed pattern noise signal, generated by the fluctuation of the amplifying transistor, into the signal accumulation unit 16 through the vertical signal line 13 and the transfer gate 15b.

Then after the noise signal readout signal φTN is shifted to the low level state, the transfer gate signal φTX is shifted to the high level state whereupon the charge accumulation is terminated in the photodiode 1 and the charge accumulated therein is transferred to the floating diffusion area 11.

Thereafter the transfer gate signal φTX is shifted to the low level state to terminate the charge transfer from the photodiode 1 to the floating diffusion area 11, thereby causing the photodiode 1 to initiate the charge accumulation again. Since the charge accumulated in the photodiode 1 is transferred to the floating diffusion area 11 until the transfer gate signal φTX is shifted to the low level state, the photodiode 1 is depleted and reaches an almost reset state.

Since the selection signal φSEL is at the high level state, an amplified signal obtained by amplification in the source follower based on the charge transferred to the floating diffusion area 11 is read out to the vertical signal line 13. Then the transfer signal φTS is shifted to the high level state, whereby the signal read out to the vertical signal line 13 is input into the signal accumulating unit 16 through the transfer gate 15a.

The signal accumulating unit 16 outputs, to the output unit, the input signal input through the transfer gate 15b and the input signal input through the transfer gate 15a in such a timing that the difference of these signals can be calculated by an unrepresented differentiating circuit. The output unit calculates the difference of the two input signals, thereby eliminating the fixed pattern noise signal, generated by the switching of the on/off state of the transfer switch 2. Subsequently the selection signal φSEL is shifted to the low level state, thereby terminating the readout operation.

During the charge accumulation in the photodiode 1, the signals supplied to the gate of the selector switch 6 and the gate of the reset switch 3 are both at the high level state, so that the voltage Vout at the vertical signal line 13 can be represented as:

$$V\text{out} = V_{PR} - V_{GS}$$

wherein $V_{PR}$ is the potential of the reset voltage source 4 and $V_{GS}$ is the voltage between the gate and source of the source follower 10.

In the present embodiment for example by selecting $V_{PR}$=3.5 V and $V_{GS}$=1.5 V, there is applied a reverse bias voltage of 2 V between the diffusion area (i in FIG. 4) and the p-well (j in FIG. 4), whereby the potential of the photoelectric conversion unit and the potential of the vertical signal line shows a relationship $V_{REV}$<Vout.

Figure 10:
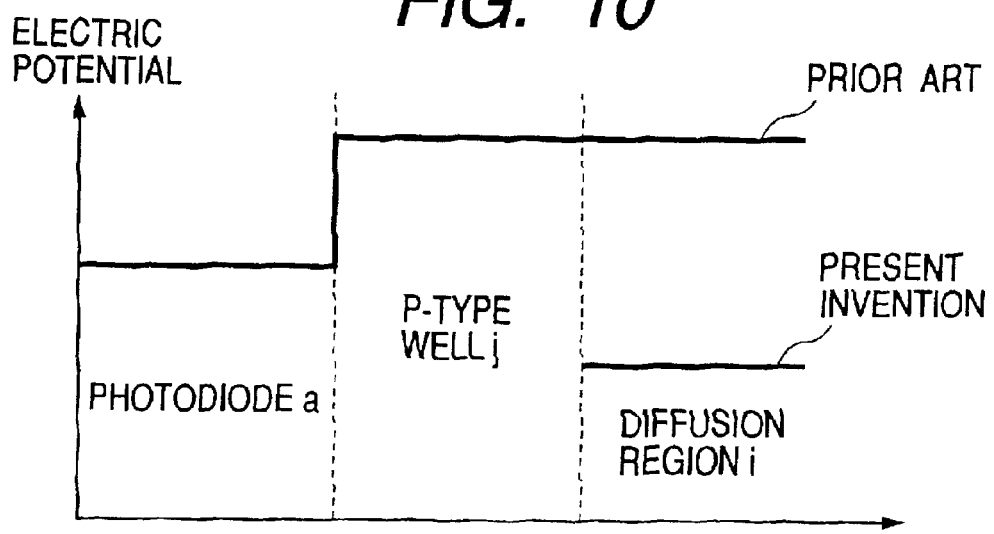
FIG. 10 is a chart showing the potential of the signal charge in the photodiode p-well and output unit in FIGS. 4, 6 and 8.

FIG. 10 shows the potentials corresponding to the signal charge in the photodiode a, the p-well j and the diffusion area i in FIG. 4. FIG. 10 also shows the potential of the diffusion area i in the conventional configuration, for the purpose of comparison. Since the potential of the diffusion area i is maintained lower than that of the photodiode a during the charge accumulation therein as explained in the foregoing, the charge of the diffusion area i does not flow to the photoelectric conversion unit a through the p-well, so that the leak current is not generated from the output unit i to the photodiode a during the charge accumulation in the photodiode 1.

In this manner, the potential of the diffusion area connected to the vertical signal line 13 is set higher than that of the cathode of the photodiode 1, and this setting allows to eliminate the flow of the charge of the diffusion area i into the photoelectric conversion unit a through the p-well. Consequently the charge accumulated in and read from the photodiode 1 contains little noise, thereby providing an image of high quality.

In the foregoing embodiment, the potential of the photodiode a is set higher than that of the diffusion area i, but a similar effect can be attained by generating a reverse bias between the p-well j and the diffusion area i regardless of the potential relationship between the photodiode a and the diffusion area i.

Figure 6:
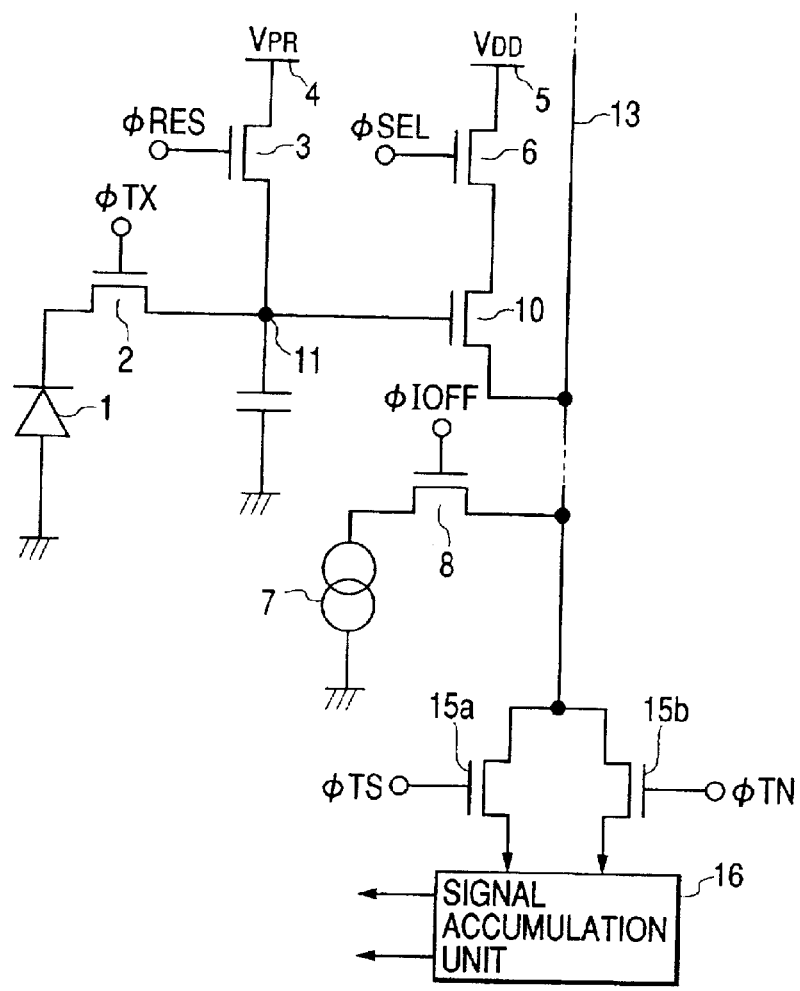
FIG. 6 is an equivalent circuit diagram of a solid-state image pickup element constituting a second embodiment of the present invention.

FIG. 6 is an equivalent circuit diagram of a solid-state image pickup element of a second embodiment of the present invention, wherein a first switch 8 is connected to the vertical signal line 13. In the present embodiment, the first switch 8 cuts off the current between the source and drain of the source follower 10 during the charge accumulation in the photodiode 1, thereby suppressing the electric power consumption. In FIG. 6, components equivalent to those in FIG. 3 are represented by corresponding numbers.

Figure 7:
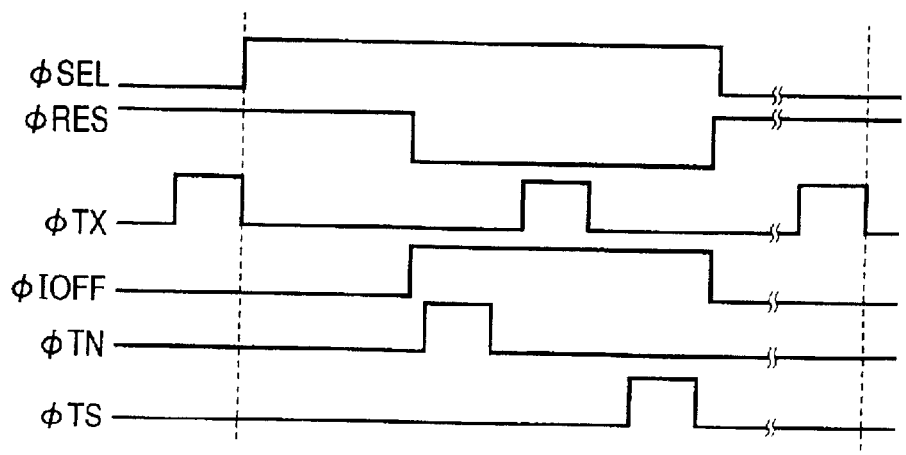
FIG. 7 is a timing chart showing the function of the element shown in FIG. 6.

FIG. 7 is a timing chart showing the function of the solid-state image pickup element shown in FIG. 6, and shows a signal φIOFF supplied to the gate of the switch 8, in addition to the selection signal φSEL, the reset signal φRES and the transfer gate signal φTX.

In the present embodiment, the signal φIOFF is shifted to the high level state at the same timing as the shift of the reset signal φRES to the low level state. Also, after the charge accumulated in the photodiode 1 is transferred to the floating diffusion area 11 by the shift of the transfer gate signal φTX to the high level state and then to the low level state, the signal φIOFF is shifted to the low level state at the same timing as the shift of the reset signal φRES to the high level state.

In this manner, the switching of the signal φIOFF to the high/low level state is executed at the same timing as the switching of the reset signal φRES to the low/high level state. Thus, in the present embodiment, the current is cut off between the source and drain of the source follower 10 during the charge accumulation in the photodiode 1, thereby suppressing the electric power consumption. In the first and second embodiments, potential control means is constituted by a drive circuit (108 in FIG. 11) for controlling the pulses so as to turn off the transfer switch and turn on the reset switch and the selector switch while the photodiode 1 accumulates the electrical signal generated by the photoelectric conversion.

Figure 8:
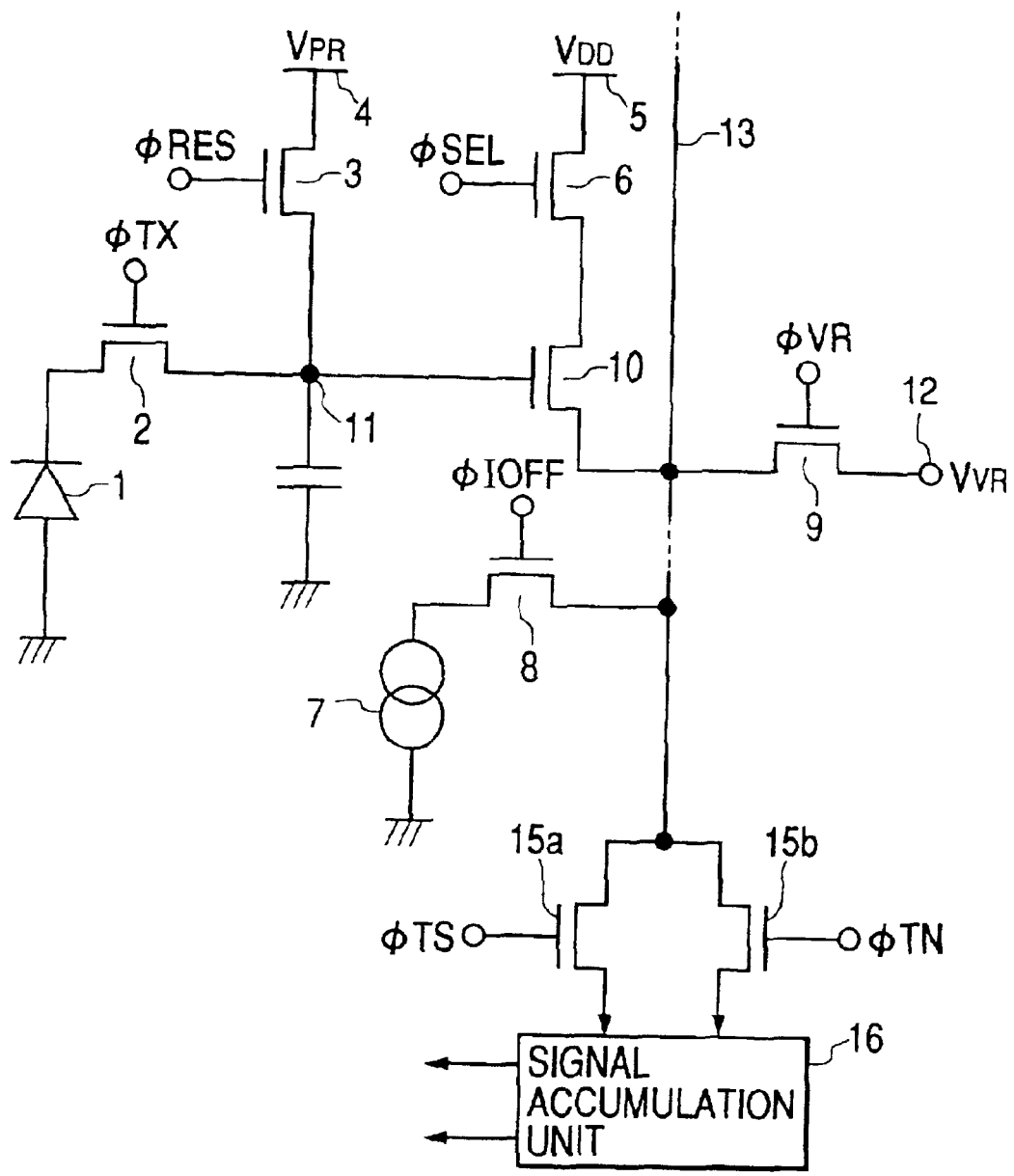
FIG. 8 is an equivalent circuit diagram of a solid-state image pickup element constituting a third embodiment of the present invention.

FIG. 8 is an equivalent circuit diagram of a solid-state image pickup element of a third embodiment of the present invention which is provided with a second switch 9 and a constant voltage source 12 for maintaining the vertical signal line 13 at a potential $V_{VR}$ higher than the potential of the photodiode 1 in the course of charge accumulation. In the present embodiment the second switch 9 and the constant voltage source 12 allow to maintain the vertical signal line 13 at a potential higher than that of the photodiode 1, not relying on the selector switch 6 etc. In FIG. 8, components equivalent to those in FIG. 6 are represented by corresponding numbers.

Figure 9:
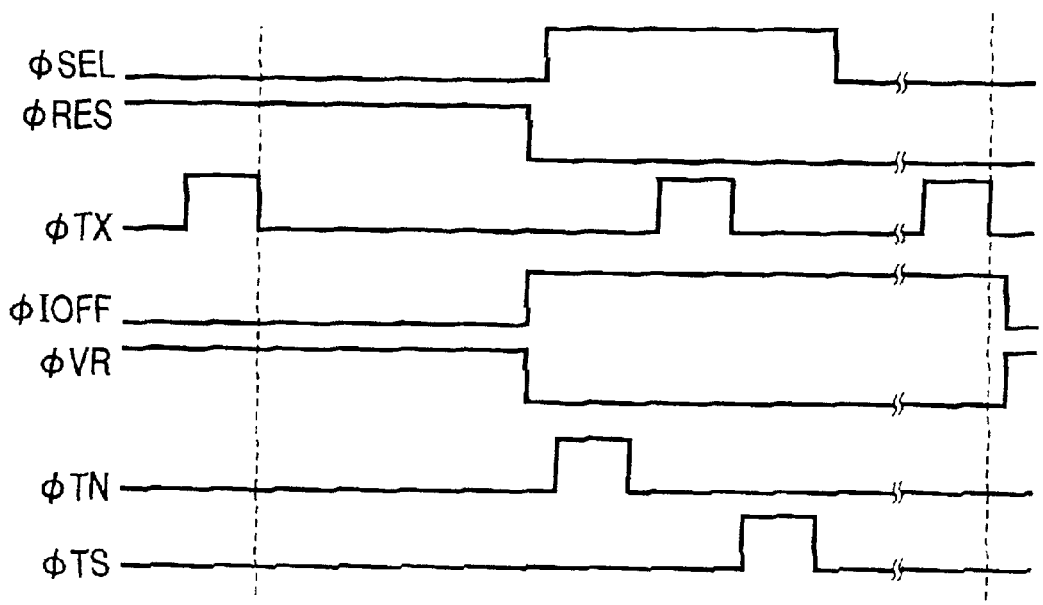
FIG. 9 is a timing chart showing the function of the element shown in FIG. 8.

FIG. 9 is a timing chart showing the function of the solid-state image pickup element shown in FIG. 8, and shows a signal φVR supplied to the gate of the second switch 9, in addition to the selection signal φSEL, the reset signal φRES, the transfer gate signal φTX and the signal φIOFF.

Further, in the first and second embodiments, the selector switch 6 may be connected between the amplifying transistor 10 and the vertical signal line 13. In the following there will be explained, with reference to FIG. 9 the function of the solid-state image pickup element shown in FIG. 8. At first, in a state where the reset signal φRES supplied to the gate of the reset switch 3 is maintained at the high level state, the transfer gate signal supplied to the gate of the transfer switch 2 is shifted to the low level state, whereby the photodiode 1 starts to accumulate the charge obtained by photoelectric conversion of the incident light.

In this state, the selection signal φSEL supplied to the gate of the selector switch 6 is also maintained at the high level state to hold the vertical signal line 13 at a potential higher than that of the photodiode 1, thereby preventing the leak current from the vertical signal line 13 to the photodiode 1.

Also as in the second embodiment, the signal φIOFF is switched to the high/low level state at the same timing as the switching of the low/high level state of the reset signal φRES. Also the signal φVR is switched to the high/low level state at the same timing as the switching of the high/low level state of the reset signal φRES.

Then the reset signal φRES supplied to the gate of the reset switch 3 is shifted to the low level state, at the same timing as the switching of the signal φIOFF to the high level state and of the signal φVR to the low level state, and the selection signal φSEL is thereafter shifted to the high level state. Then the noise readout signal φTN is shifted to high level state to input the fixed pattern noise, generated by the switching of the transfer switch 2 to the high and low level states, into the signal accumulating unit 16 through the vertical signal line 13 and the transfer gate 15b.

Subsequently after the noise readout signal φTN is shifted to the low level state, the transfer gate signal φTX is shifted to the high level state, whereby the charge accumulation in the photodiode 1 is terminated and the charge accumulated therein is transferred to the floating diffusion area 11.

Then the transfer gate signal φTX is shifted to the low level state to terminate the charge transfer from the photodiode 1 to the floating diffusion area 11, thereby causing the photodiode 1 to execute the charge accumulation again. Since the charge accumulated in the photodiode 1 is transferred to the floating diffusion area 11 until the transfer gate signal φTX is shifted to the low level state, the photodiode 1 is depleted and almost assumes a reset state.

Since the selection signal φSEL is in the high level state, the amplified signal obtained by amplification in the source follower 10 based on the charge transferred to the floating diffusion area 11 is read out to the vertical signal line 13. Then the transfer signal φTS is shifted to the high level state, whereby the signal read out to the vertical signal line 13 is input into the signal accumulating unit 16 through the transfer gate 15a.

The signal accumulating unit 16 outputs, to the output unit, the input signal input through the transfer gate 15b and the input signal input through the transfer gate 15a in such a timing that the difference of these signals can be calculated by an unrepresented differentiating circuit. The output unit calculates the difference of the two input signals, thereby eliminating the fixed pattern noise signal, generated by the switching of the on/off state of the transfer switch 2. Subsequently the selection signal φSEL is shifted to the low level state, thereby terminating the readout operation.

In the present embodiment, as the signal φVR is maintained at the high level state during the charge accumulation in the photodiode 1, the vertical signal line 13 can be maintained by the constant voltage source 12 at a potential higher than that of the photodiode 1. It is therefore rendered possible to avoid the leak current from the vertical signal line 13 to the photodiode 1 without shifting the selection signal φSEL to the high level state as in the first embodiment. Consequently the charge accumulated in the photodiode 1 and read therefrom has little noise and can provide an image of high quality.

In the present third embodiment, as in the foregoing first and second embodiments, a similar effect can also be attained by generating a reverse bias between the p-well j and the diffusion area i regardless of the potential relationship between the photodiode a and the diffusion area i.

In the third embodiment, potential control means is constituted by a drive circuit (108 in FIG. 11) for controlling the pulses so as to turn on the second switch 9 while the second switch 9, the constant voltage source 12 and the photodiode 1 accumulate the electrical signal generated by the photoelectric conversion.

In the foregoing third embodiment, a pixel is constituted by the photodiode 1, the transfer switch 2, the reset switch 3, the selector switch 6 and the amplifying transistor 10, but a different pixel configuration may be used, for example a pixel being constituted by the photodiode 1 and the transfer switch 2.

In the following there will be explained, with reference to FIG. 11, a fourth embodiment in which the solid-state image pickup element of the first to third embodiments is applied to an image pickup apparatus (still camera).

Figure 11:
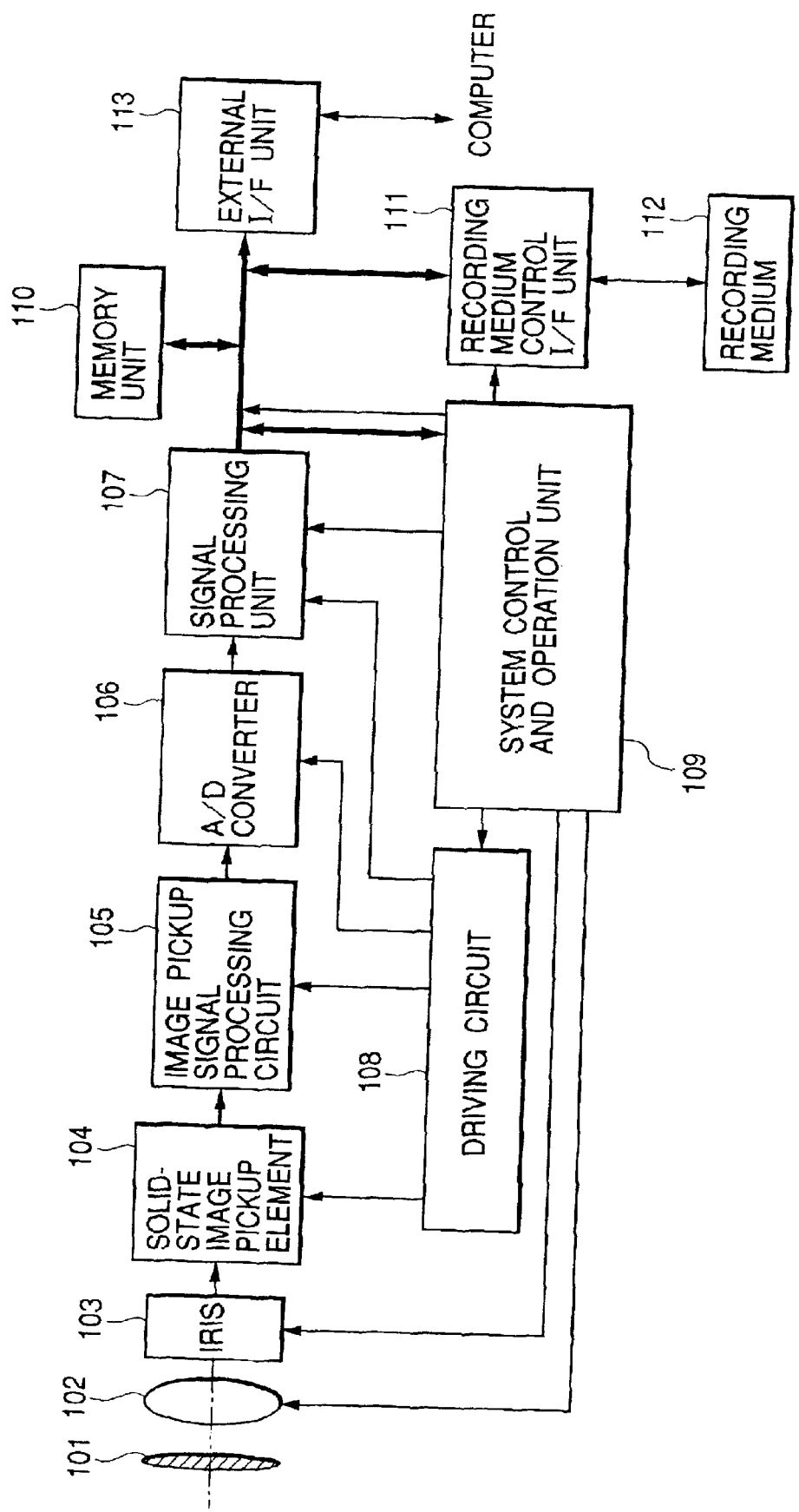
FIG. 11 is a view showing an image pickup apparatus utilizing the solid-state image pickup element of the embodiments 1 to 3.

In FIG. 11, there are shown a barrier 101 serving as protection of the lens and also as a main switch; a lens 102 for focusing the optical image of an object on the solid-state image pickup element 104; an iris 103 for regulating the amount of light passing through the lens 102; a solid-state image pickup element 104 for fetching the object focused by the lens 102 as an image signal (as explained in the foregoing first to third embodiments); an A/D converter 106 for executing analog-to-digital conversion of the image signal outputted from the solid-state image pickup element 104; a signal processing unit 107 for applying various corrections and data compression on the image data outputted from the A/D converter 106; a drive circuit 108 for supplying various timing signals to the solid-state image pickup element 104, image signal processing circuit 105, A/D converter 106 and signal processing unit 107; a control/calculation unit 109 for executing various calculations and controlling the entire still video camera; a memory unit 110 for temporarily storing the image data; an interface unit 111 for executing recording in or readout from a recording medium; a detachable recording medium 112 composed for example of a semiconductor memory for recording or reading the image data; and an interface unit 113 for communication for example with an external computer.

In the following there will be explained the function of the image pickup apparatus of the aforementioned configuration in the image pickup operation.

When the barrier 101 is opened, the main power supply is turned on, and then the power supply is turned on for the control system and then for the image pickup circuits such as the A/D converter 106.

Then, in order to control the exposure amount, the control/calculation unit 109 fully opens the iris 103, and the signal outputted from the solid-state image pickup element 104 is converted in the A/D converter 106 and is supplied to the signal processing unit 107. The control/calculation unit 109 executes the exposure calculation based on such data.

The luminance is judged from such photometry, and the control/calculation unit 109 controls the iris based on this result.

Subsequently, based on the signal from the solid-state image pickup element 104, a high frequency component is extracted and is used in the calculation of the distance to the object in the control/calculation unit 109. Thereafter the lens is driven and there is judged whether the lens is in the in-focus position, and, if not the lens is driven again for distance measurement.

The main exposure is started after the in-focus position is confirmed.

When the exposure is terminated, the image signal outputted from the solid-state image pickup element 104 is subjected to A/D conversion by the A/D converter 106, then passed by the signal processing unit 107 and stored by the control/calculation unit 109 in the memory unit 110.

Thereafter the data stored in the memory unit 110 are passed by the recording medium controlling I/F unit and is recorded in the detachable recording medium 112 such as a semiconductor memory, under the control of the control/calculation unit 109.

The image data may be directly inputted, through the external I/F unit 113, to a computer or the like for image processing.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus comprising:
    a pixel including a photoelectric conversion unit having a second area of a second conductive type formed in a first area of a first conductive type and a readout circuit which applies an electrical signal generated in the photoelectric conversion unit to a signal line;
    a diffusion area of a second conductive type, formed in the first area and connected to the signal line; and
    a potential control circuit which maintains a reverse bias between the first area and said diffusion area during an accumulation operation of the photoelectric conversion unit.

2. An image pickup apparatus according to claim 1, wherein said potential control circuit includes a power source for maintaining a reverse bias between said diffusion area and the first area, and wherein a second switch, connected to the power source and the signal line, is turned on while the photoelectric conversion unit accumulates the electrical signal.

3. An image pickup apparatus according to claim 1, further comprising:
    a constant current source for supplying the signal line with a constant current; and
    a first switch connecting said constant current source and the signal line,
    wherein said first switch is turned off while the photoelectric conversion unit accumulates the electrical signal.

4. An image pickup apparatus according to claim 1, further comprising:
    an analog-digital conversion circuit for converting the signal from said pixel into a digital signal; and
    a signal processing circuit for processing the signal from said analog-digital conversion circuit.

5. An image pickup apparatus according to claim 1, wherein said pixel includes:
    a transfer circuit which tranfers the electrical signal from said the photoelectric conversion unit;
    an accumulation area for accumulating the transferred electrical signal;
    a reset switch for resetting the potential of said accumulation area to a reset potential; and
    a selection circuit which reads out the electrical signal accumulated in said accumulation area to the signal line.

6. An image pickup apparatus according to claim 5, wherein said potential control circuit causes the photoelectric conversion unit to accumulate the electrical signal in a state where said transfer circuit is turned off while said selection circuit and said reset switch are turned on, thereby maintaining a reverse bias between the first area and said diffusion area.

* * * * *